(12) United States Patent
Iwamoto et al.

(10) Patent No.: US 6,647,045 B2
(45) Date of Patent: Nov. 11, 2003

(54) SEMICONDUCTOR LASER DEVICE AND METHOD OF MANUFACTURING THE SAME

(75) Inventors: Koji Iwamoto, Kanagawa (JP); Hiroki Nagasaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/950,786

(22) Filed: Sep. 13, 2001

(65) Prior Publication Data

US 2002/0034204 A1 Mar. 21, 2002

(30) Foreign Application Priority Data

Sep. 14, 2000 (JP) ...................................... 2000-279552

(51) Int. Cl.⁷ ............................................. H01S 3/19
(52) U.S. Cl. ............................ 372/46; 372/45; 372/43
(58) Field of Search ............................. 372/46, 45, 43, 372/48, 96; 257/623; 437/129

(56) References Cited

U.S. PATENT DOCUMENTS

| | | | | |
|---|---|---|---|---|
| 5,189,680 A | * | 2/1993 | Kimura ........................ | 372/45 |
| 5,600,667 A | * | 2/1997 | Kidoguchi et al. ............ | 372/45 |
| 5,953,357 A | * | 9/1999 | Hirata et al. .................. | 372/45 |
| 5,960,020 A | * | 9/1999 | Nagai ............................ | 372/46 |
| 6,055,253 A | * | 4/2000 | Kidoguchi et al. ............ | 372/45 |
| 6,330,263 B1 | * | 12/2001 | Garbuzov et al. ............. | 372/43 |
| 6,456,640 B1 | * | 9/2002 | Okumura ....................... | 372/45 |

* cited by examiner

*Primary Examiner*—Paul Ip
*Assistant Examiner*—Dung Nguyen
(74) *Attorney, Agent, or Firm*—Rader, Fishman & Grauer PLLC; Ronald P. Kananen, Esq.

(57) ABSTRACT

There is provided a long-life and highly reliable air ridge type semiconductor laser device having a multi-layer structure including a first cladding layer of n-$Al_{0.7}GaInP$, an active layer of AlGaAs, a second cladding layer of p-$Al_{0.7}GaInP$ and a contact (capping) layer of p-GaAs epitaxially grown in this sequential order on a substrate of n-GaAs, in which the contact layer and an upper portion of the second cladding layer is etched to be a ridge stripe, and the second cladding layer comprises an upper layer, which constitutes the ridge stripe together with the contact layer, and a lower layer having a thickness of 0.3 $\mu$m, which is positioned below the upper layer and extend outwardly from the both lower ends of the upper layer, and further, the semiconductor laser device includes a protection layer being an epitaxially grown n-GaAs layer having a film thickness of 0.15 $\mu$m provided on an upper surface of the lower layer of the second cladding layer and side planes of the ridge stripe other than an upper surface thereof.

6 Claims, 6 Drawing Sheets

PRIOR ART

FIG. 6

SEMICONDUCTOR LASER DEVICE AND METHOD OF MANUFACTURING THE SAME

CROSS REFERENCES TO RELATED APPLICATIONS

The present document is based on Japanese Priority Document JP 2000-279552, filed in the Japanese Patent Office on Sep. 14, 2000, the entire contents of which being incorporated herein by reference.

BACKGROUND OF THE INVENTION

1. Field of the Invention

The present invention relates to an air ridge type semiconductor laser device and a manufacturing method of the semiconductor laser device. In particular, the present invention relates to a long-life air ridge type semiconductor laser device having an excellent characteristic in relation between injection current and light output and a manufacturing method thereof.

2. Description of the Related Art

There are a variety of structures for a waveguide structure of a semiconductor laser device. Among those known structures, an air ridge waveguide type semiconductor laser device, which is often compared with that of an embedded waveguide type semiconductor laser device, has been focused as a waveguide structure which can be easily fabricated. Such an air ridge waveguide type semiconductor laser device (hereinafter, simply referred to as an "air ridge type semiconductor laser device") can be fabricated in a following manner. First, an upper portion of an upper cladding layer is etched to form a ridge stripe. Due to a thickness of a lower portion of the upper cladding layer, which is left to elongatedly extend outwardly from a lower end edge, a predetermined difference in refractive index in a lateral (horizontal) direction is provided. Thereby, a waveguide having an optical confinement structure in the lateral direction can be realized. The air ridge type semiconductor laser device has advantages in that it is easy to form an optical waveguide, and that it requires less operational current because it is based on real refractive index waveguide which brings small internal loss.

Figure 6:
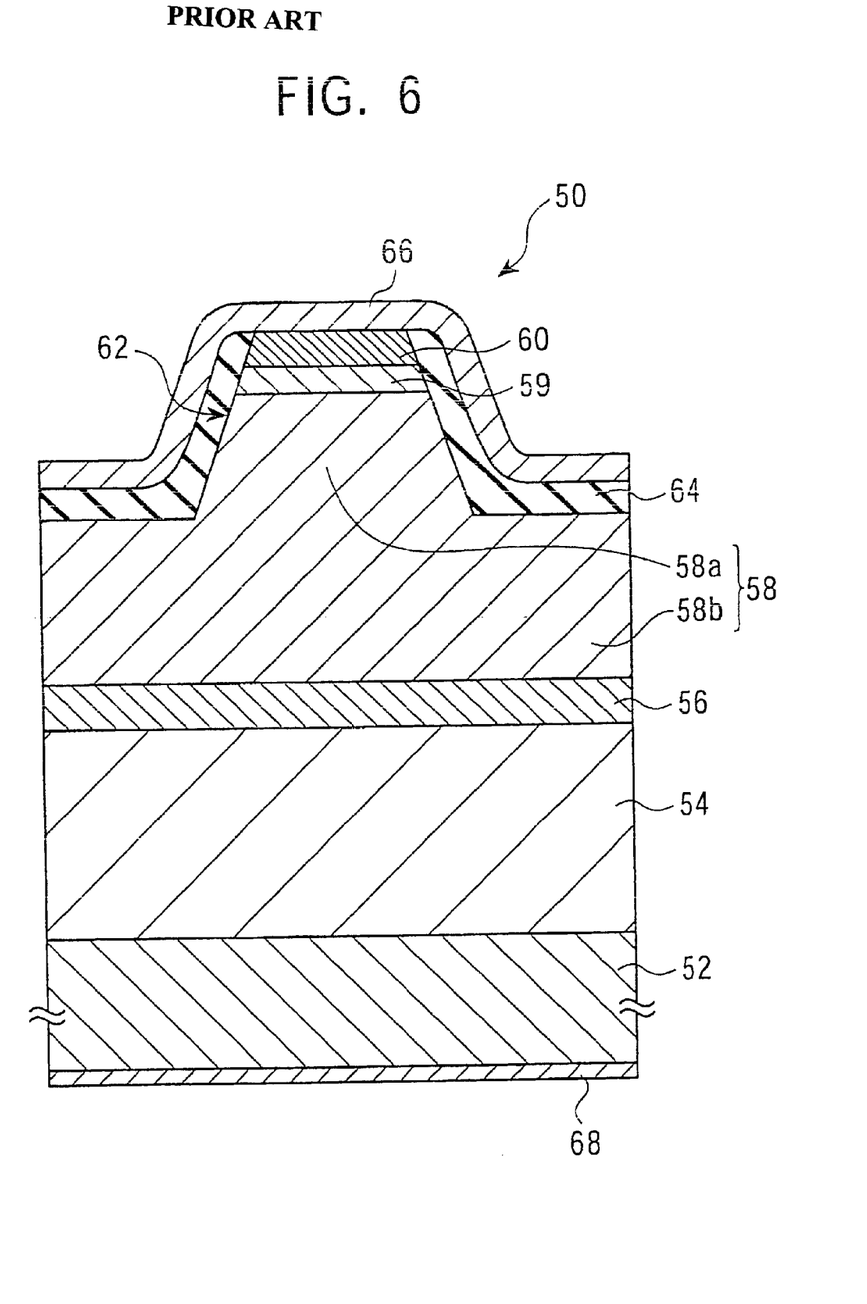
FIG. 6 is a cross sectional view showing a constitution of a conventional air ridge type semiconductor laser device.

Now, with reference to FIG. 6, an AlGaInP-containing air ridge type semiconductor laser device is taken as an example to explain a structure of a conventional air ridge type semiconductor laser device. FIG. 6 is a cross sectional view showing the structure of the conventional air ridge type semiconductor laser device. The conventional air ridge type semiconductor laser device 50 has a multi-layer structure including an n-GaAs substrate 52, and epitaxially grown layers are formed thereon in the sequential order of a first cladding layer (lower cladding layer) 54 of n-AlGaInP, an active layer 56 of GaInP, a second cladding layer (upper cladding layer) 58 of p-AlGaInP, an intermediate layer 59 of p-GaInP and a contact (capping) layer 60 of p-GaAs.

In the multi-layer structure, the contact layer 60, the intermediate layer 59 of p-GaInP and an upper portion of the second cladding layer 58 are etched to be a ridge stripe 62.

In other words, the second cladding layer 58 comprises an upper layer 58a which, together with the contact layer 60 and the intermediated layer 59, forms the ridge stripe 62, and a thin lower layer 58b which is positioned below the upper layer 58a and elongatedly extends from both bottom ends of the upper layer 58a outwardly. A dielectric film, for example, an SiO$_2$ film is stacked as a protection layer 64 on an upper surface of the lower layer 58b and side planes of the ridge 62. However, an upper surface of the ridge 62 to be a current injection region is not covered with the protection layer 64. In addition, a p-electrode 66 is formed on the protection layer 64 and on the contact layer 60 which is exposed from the protection layer 64, and n-electrode 68 is formed on a back surface (bottom surface in the figure) of the GaAs substrate 52.

Such a conventional air ridge type semiconductor laser device has a fatal problem that the period during which the device can operate exhibiting a predetermined operational property, that is, the device has a short life. For example, there is a problem that when a fixed light output is required, the longer the operating period is, the higher the operational current becomes. In other words, if the operational current is constant, the light output diminishes as the operating period becomes longer. This problem has been noticeably found in air ridge type semiconductor laser devices made of materials containing AlGaAs or AlGaInP, in particular.

As a result, it is difficult to use the air ridge type semiconductor laser device in a field of a light source for an optical pickup used in an optical disk recording/reproducing apparatus, for example, which requires high reliability. Accordingly, under the present circumstances, the air ridge type semiconductor laser devices are used only in a field of a laser pointer, for example, which requires relatively low reliability.

Accordingly, there is a need for a high-reliable long-life air ridge type semiconductor laser device.

During the study of the conventional air ridge type semiconductor device, the Inventors have conceived that one of the factors of the short life of the air ridge type semiconductor laser device is brought by follows. That is, since an interface between the cladding layer exposed by etching and the dielectric film or an ohmic metal (a metal used for an ohmic electrode) at the formation of the ridge is chemically instable, at the time of laser operation, operational current injection accelerates the deterioration of crystals in the cladding layer. In consideration thereof, the Inventors have hit upon an idea to have an epitaxially grown layer having a lattice constant close to that of the second cladding layer on the second cladding layer, as a protection layer, so as to chemically stabilize the second cladding layer. After carrying out various experiments based on the idea, the Inventors have invented the semiconductor laser device and the manufacturing method thereof, which are claimed in the application.

SUMMARY OF THE INVENTION

According to a first aspect of the present invention, there is provided an air ridge type semiconductor laser device comprising a structure including an active layer sandwiched between a first cladding layer (lower cladding layer) and a second cladding layer (upper cladding layer) each having a conductivity type different from each other. The second cladding layer comprises an upper layer which forms a ridge stripe, and a lower layer positioned below the upper layer, which elongatedly extends from both lower ends of the upper layer outwardly. A protection layer is provided on an upper surface of the lower layer of the second cladding layer and side planes of the ridge stripe other than an upper surface thereof. In the air ridge type semiconductor laser device, the protection layer is a compound semiconductor layer epitaxially grown on the upper surface of the lower layer of the second cladding layer and the side planes of the ridge stripe.

According to the present invention, the epitaxially grown layer is provided as the protection layer so that crystals of the second cladding layer are prevented from deterioration. Accordingly, the conventional problem that, when a constant light output is required, a longer operating period raises the operational current, that is, the problem that, if the operational current is constant, the longer operating period lowers the light output does not occur in the present invention.

The present invention may be applied without any limitation to materials for the compound semiconductor multilayer structure which forms the structure in which the active layer is sandwiched between the cladding layers having different conductivity types. In addition, there is no limitation to the composition of the second cladding layer.

It is preferable that the compound semiconductor layer constituting the protection layer is a compound semiconductor layer having a conductivity type different from that of the second cladding layer. According to the arrangement above, the protection layer functions as a current confinement region due to p-n junction separation, which leads to better injection current-light output characteristics.

In addition, since it is required to have the protection layer epitaxially grown on the lower layer of the second cladding layer and side planes of the ridge, in order to have the protection layer and the second cladding layer lattice-matched, the lattice constants of those layers are preferably close to each other. More preferably, the difference between the lattice constant of the protection layer and that of the second cladding layer is 6% or less of the lattice constant of the second cladding layer. For example, in a case where the structure in which the active layer is sandwiched between cladding layers each having a conductive type different from each other is constituted with an AlGaInP-containing compound semiconductor, that is, in a case where the second cladding layer is a layer of AlGaInP, the protection layer preferably comprises GaAs or GaInP.

Film thickness of the epitaxial compound semiconductor layer constituting a protection layer is 0.15 $\mu$m or more and 0.3 $\mu$m or less.

The Inventors have confirmed through their experiments that the effect of the present invention can be sufficiently achieved if the protection layer has a thickness of 0.15 $\mu$m or more. Because it is a function of the protection layer to stabilize a surface condition of the second cladding layer which has an etching surface which is chemically unstable on a surface thereof, a film thickness enough for stabilizing the etching surface is sufficient for the function of the protection layer.

Accordingly, a film thickness which can be uniformly epitaxially grown by using MOCVD (Metal Organic Chemical Vapor Deposition) method or the like is the lower limit for the protection layer. In other words, 0.15 $\mu$m or more is enough for the thickness of the protection layer.

On the other hand, 0.3 $\mu$m for the upper limit of the protection layer is based on the following thoughts. In consideration of the manufacturing process of the semiconductor laser device, the protection layer is desirable to have a composition which can be epitaxially grown on the second cladding layer by the selective area growth method. For example, if the second cladding layer comprises AlGaInP, the protection layer is preferably comprised of GaAs or GaInP. In a case where these materials are employed in an AlGaInP-containing laser multilayer structure, the difference between a lattice constant of the second cladding layer and that of the protection layer can be 0.6% or less of the lattice constant of the second cladding layer, which is a requirement for a good epitaxial growth.

A band gap of these compound semiconductor layers is smaller than a laser oscillation wavelength of the semiconductor laser device, for example, 650 nm in AlGaInP-containing compound semiconductor. Accordingly, the light loss due to the light absorption by the compound semiconductor protection layer offsets reduction of the internal loss which is a merit of the air ridge waveguide structure. From this point of view, an appropriate thickness of the protection layer is 0.3 $\mu$m or less. Conversely speaking, it is difficult to further improve the effect of the present invention with the protection layer having a thickness more than 0.3 $\mu$m.

It is preferable that the lower layer of the second cladding layer has a thickness of 0.6 $\mu$m or less. The thickness of the lower layer of the second cladding layer, which forms a low refractive index region, is determined in accordance with the following thoughts. It has not been made clear how the operational characteristics of the semiconductor laser device are deteriorated, in a narrow sense. One of the factors of the operational characteristics deterioration is considered to be a model in which a natural emitted light from an active layer is recombined at an interfacial energy level to encourage increase of defects. If such a consideration is correct, the lower layer of the second cladding layer, if only it is as thick as a cladding layer of a usual semiconductor laser device, exhibits the effect of the present invention.

Accordingly, since a general thickness of a cladding layer of a semiconductor laser device is within a range of about 1 $\mu$m to 2 $\mu$m, the compound semiconductor protection layer is effectively used in a semiconductor laser device in which the lower layer of the second cladding layer has a thickness of 2 $\mu$m or less. In particular, in a case where the thickness of the lower layer of the second cladding layer is 0.6 $\mu$m or less, an effect of forming a refractive-index waveguide is improved and a low-current operation peculiar to the air ridge structure is enabled so that the effectiveness of the present invention is improved.

According to the present invention, by providing an epitaxially grown compound semiconductor layer as a protection layer on a surface of the lower layer of the second cladding layer and side planes of the ridge, an operational lifetime of the air ridge type semiconductor laser device becomes significantly longer than a conventional air ridge type laser device. In the semiconductor laser device according to the present invention, since the injection current-light output characteristics are improved, the operational current with regard to the same light output is lower in comparison with the conventional air ridge type semiconductor device.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which.

Each of FIGS. 2A to 2C is a cross sectional view showing a step of a manufacturing process of a semiconductor laser device in accordance with a method of an embodiment of the present invention.

DESCRIPTION OF THE PREFERRED EMBODIMENTS

Referring now to the attached drawings, embodiments of the present invention will be specifically and precisely described citing practical embodiments.

<An Example of an Air Ridge Type Semiconductor Laser Device>

Figure 1:
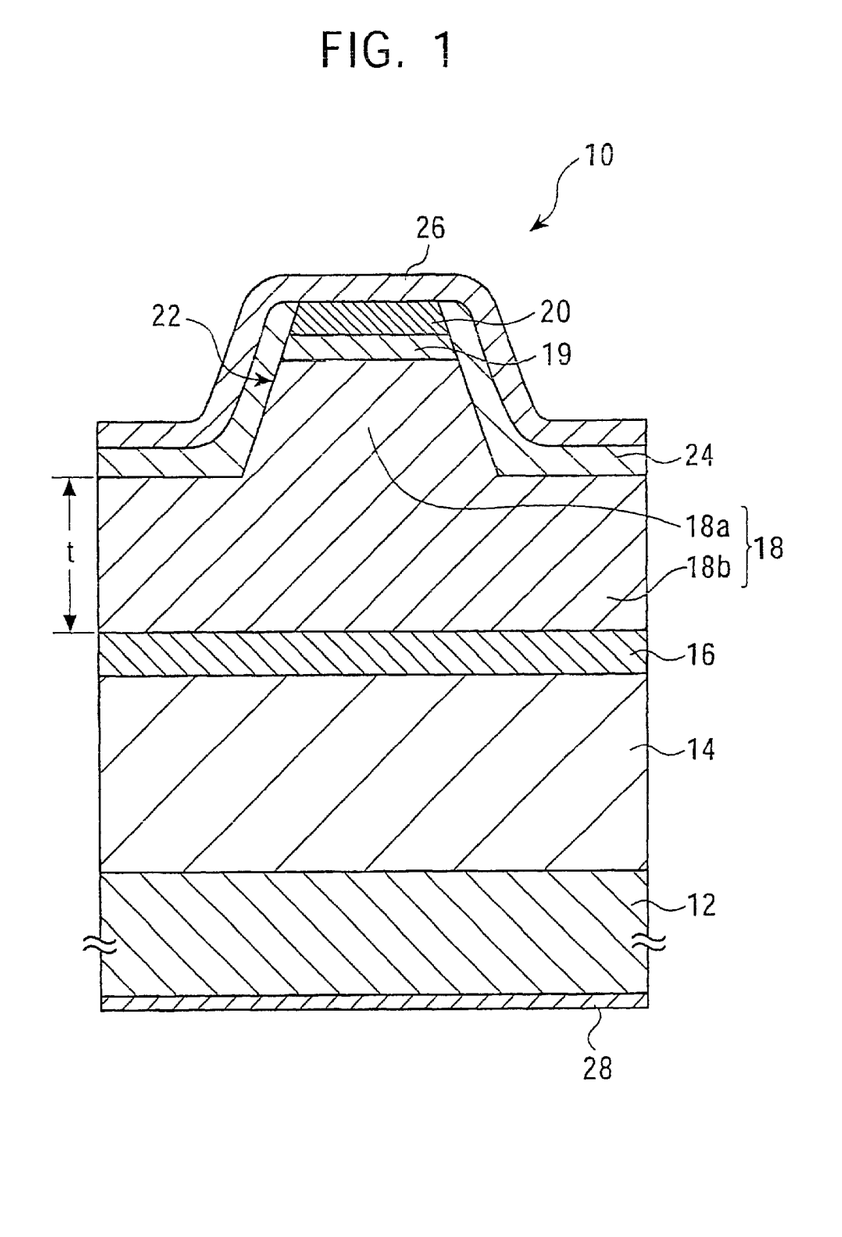
FIG. 1 is a cross sectional view showing a constitution of an air ridge type semiconductor laser device of an embodiment of the present invention.

This example is an embodiment exemplifying the air ridge type semiconductor laser device in accordance with the present invention. FIG. 1 is a cross sectional view showing a structure of the air ridge type semiconductor device of the present embodiment. The semiconductor laser device 10 of the present embodiment is an AlGaInP-containing air ridge type semiconductor device. As shown in FIG. 1, on an n-GaAs substrate 12, an epitaxially grown layers are formed thereon in the sequential order of a first cladding layer (lower cladding layer) 14 of n-Al$_{0.7}$GaInP having a film thickness of 1.5 $\mu$m and a carrier density of $\times 10^{17}$ cm$^{-3}$, an active layer 16 of GaInP, a second cladding layer (upper cladding layer) 18 of p-Al$_{0.7}$GaInP having a film thickness of 1.5 $\mu$m and a carrier density of $5 \times 10^{17}$ cm$^{-3}$, an intermediate layer 19 of p-GaInP, and a contact (capping) layer 20 of p-GaAs having a film thickness of 0.3 $\mu$m and a carrier density of $1 \times 10^{19}$ cm$^{-3}$ to have a multi-layer structure.

In the multi-layer structure, the contact layer 20, the intermediate layer 19 and an upper portion of the second cladding layer 18 are etched to be a ridge stripe 22. In other words, the second cladding layer 18 comprises an upper layer 18a which constitutes the ridge stripe 22 together with the contact layer 20 and the intermediate layer 19, and a thin lower layer 18b which is positioned below the upper layer 18a and elongatedly extends from both lower edges of the upper layer 18a of the second cladding layer 18. In the present embodiment, the thickness "t" of the lower layer 18b of the second cladding layer 18 (see FIG. 1) is 0.3 $\mu$m.

An epitaxially grown protection layer 24 of n-GaAs having a film thickness of 0.15 $\mu$m and a carrier density of $5 \times 10^{17}$ cm$^{-3}$ is provided on an upper surface of the lower layer 18b and side planes, other than an upper surface to be a current injection region, of the ridge stripe 22.

A metal film which has an ohmic contact with the contact layer, for example, a multi-layer metal film of Ti/Pt/Au, is formed as a p-electrode 26 on the protection layer 24 and on the contact layer 20 at a portion exposed from the protection layer 24. On a back surface (bottom surface in the figure) of the n-GaAs substrate 12, an ohmic contact metal film, such as a multi-layer metal film of AuGe/Ni/Au, is formed as an n-electrode 28.

<An Example of a Manufacturing Method of a Semiconductor Laser Device>

Figure 2A:
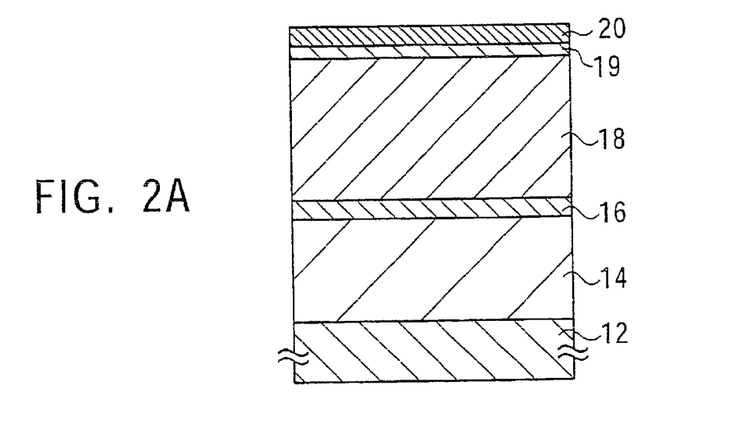
Figure 2B:
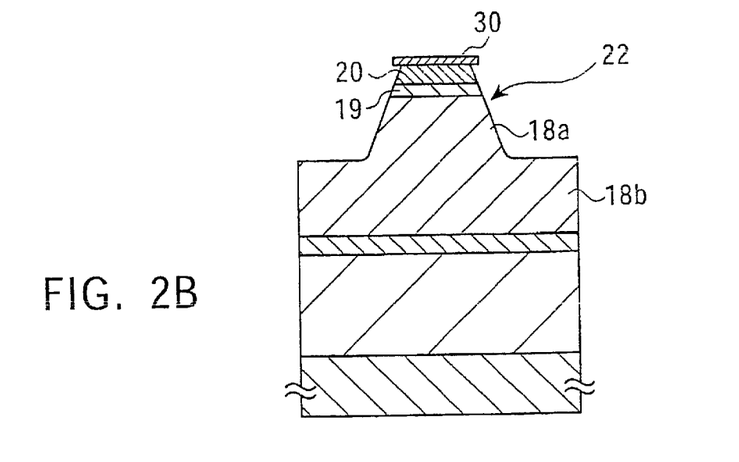
Figure 2C:
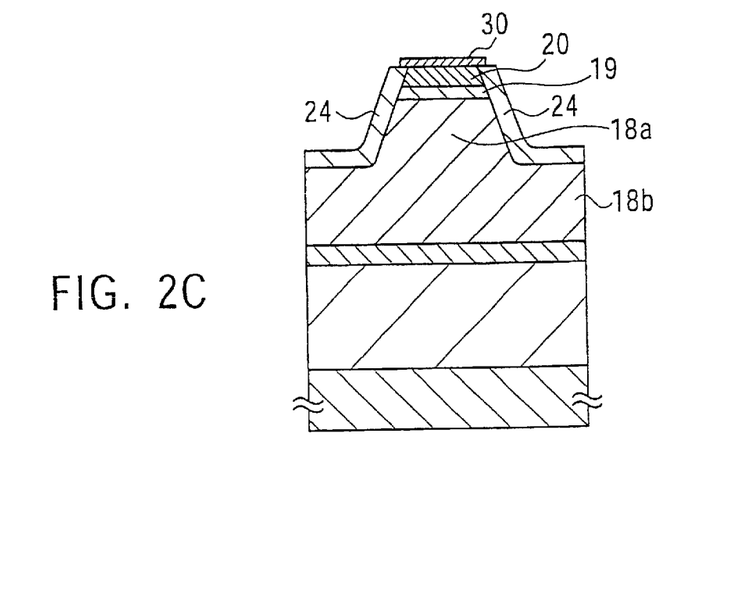

This example is an embodiment exemplifying the air ridge type semiconductor laser device 10 to which a manufacturing method of a semiconductor laser device in accordance with the present invention is applied. Each of FIG. 2A to FIG. 2C shows a cross sectional view of each of the steps for fabricating the semiconductor device in accordance with the method of the present embodiment. First, as shown in FIG. 2A, on a surface of the n-GaAs substrate 12, the first cladding layer 14 of n-Al$_{0.7}$GaInP having a film thickness of 1.5 $\mu$m and a carrier density of $5 \times 10^{17}$ cm$^{-3}$, the active layer 16 of GaInP, the second cladding layer 18 of p-Al$_{0.7}$GaInP having a film thickness of 1.5 $\mu$m and a carrier density of $5 \times 10^{17}$ cm$^{-3}$, the intermediate layer 19 of p-GaInP and the contact layer 20 of p-GaAs having a film thickness of 0.3 $\mu$m and a carrier density of $1 \times 10^{19}$ cm$^{-3}$ are epitaxially grown in this sequential order, using the MOCVD method or the like, to have a multi-layer structure.

Subsequently, as shown in FIG. 2B, an SiN film is formed on the contact layer 20 and is patterned to form an etching mask 30. Then, the contact layer 20, the intermediate layer 19 and the upper portion of the second cladding layer 18 are etched to form the ridge stripe 22. At this time, the lower portion of the second cladding layer 18 to be the lower layer 18b is not etched off. According to the procedure, the second cladding layer 18 is processed to be the upper layer 18a formed to be a part of the ridge stripe 22 and the lower layer 18b having a thickness of 0.3 $\mu$m, which is positioned below the ridge stripe 22 and extends outwardly from the both lower ends of the ridge stripe 22.

Next, as shown in FIG. 2C, using the etching mask 30 as a mask for the selective area growth method, the n-GaAs layer having a film thickness of 0.15 $\mu$m and a carrier density of $5 \times 10^{17}$ cm$^{-3}$ is epitaxially grown as the protection layer 24 by the MOCVD method on the side planes of the ridge stripe 22 and an upper surface of the lower layer 18b of the second cladding layer 18.

Subsequently, the etching mask 30 is removed, and the p-electrode 26 comprised of an ohmic contact metal film, for example, a multi-layer metal film of Ti/Pt/Au is formed on the protection layer and on the contact layer 20 at the portion exposed from the protection layer 24. On the backside (rear surface) of the n-GaAs substrate 12, the n-electrode 28 comprised of an ohmic contact metal film, for example, a multi-layer metal film of AuGe/Ni/Au is formed. In this way, the semiconductor laser device 10 as shown in FIG. 1 can be formed.

Now, in order to evaluate performance of semiconductor laser device 10 of the present embodiment, the following operational experiments were carried out.

<Experiment 1>

Figure 3:
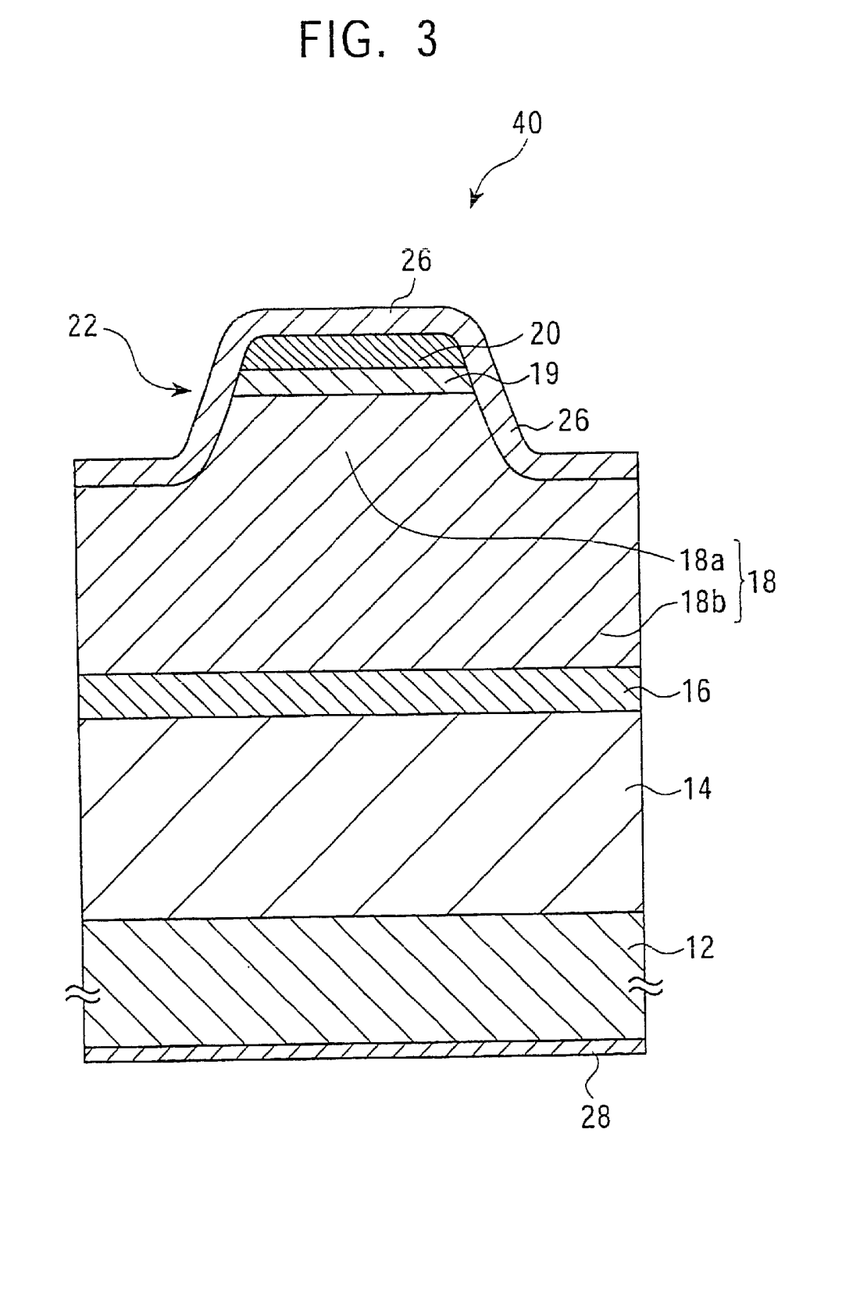
FIG. 3 is a cross sectional view showing a constitution of a comparative semiconductor laser device for a comparative example in an experiment.

First, as a comparative example, a semiconductor laser device having the same oscillator structure but no protection layer 24 as provided in the semiconductor laser device 10, that is, as shown in FIG. 3, a semiconductor laser device having a p-electrode formed directly on a surface of a lower layer of a second cladding layer and a ridge (hereinafter, referred to as a "comparative semiconductor laser device") is subject to the operational experiment.

As shown in FIG. 3, the comparative semiconductor laser device 40 has a multi-layer structure in which epitaxially grown layers including a first cladding layer of n-Al$_{0.7}$GaInP, an active layer 16 of GaInP, a second cladding layer 18 of p-Al$_{0.7}$GaInP, an intermediated layer 19 of p-GaInP and a contact (capping) layer 20 of p-GaAs are formed in this order on a substrate 12 of n-GaAs, as in the case of the semiconductor laser device 10. In the multi-layer structure, the contact layer 20, the intermediate layer 19 and an upper portion of the second cladding layer 18, which are to be an upper layer 18a, are etched to form a ridge stripe 22, as in the case of the semiconductor laser device 10. In the comparative semiconductor laser device 40, a multi-layer metal film of Ti/Pt/Au is formed as a p-electrode 26 on an upper surface of a lower layer 18b of the second cladding layer 18 and the ridge 22, and a multi-layer metal film of AuGe/Ni/Au is formed as an n-electrode 28 on a rear surface of the n-GaAs substrate 12.

Figure 4:
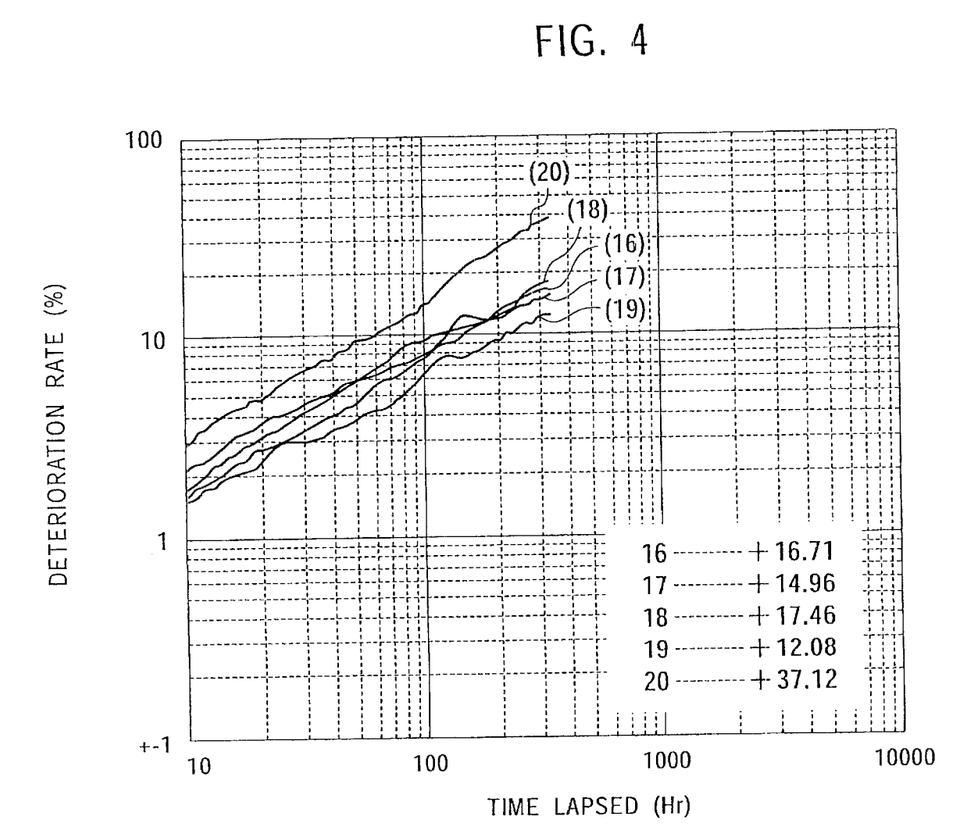
FIG. 4 is a graph showing a result of Experiment 1, which shows relationship between the lapsed time after start of the operation of the comparative semiconductor laser devices and deterioration rate corresponding to the lapsed time.

The comparative semiconductor laser device 40 is continuously operated at a constant light output, and, in accordance with the time lapsed after the start of the operation, each operational current is measured to calculate an increasing rate of the operational current. FIG. 4 shows the results thereof. In FIG. 4, an abscissa axis indicates the time lapsed after the operation start, and an ordinate axis indicates deterioration rate of every lapsed time. Herein, the term "deterioration rate" is used analogously to an increasing rate of operational current. For example, 10% of deterioration rate means that an operational current at the time of the measurement is 1.1 times, that is, 10% added to an operational current at the time the operation starts, at a constant light output. Reference numerals 16, 17, 18, 19 and 20 are numbers of samples for the comparative semiconductor laser device used as test samples.

As can be seen from FIG. 4, the deterioration rates of the comparative semiconductor laser devices are remarkably high. The maximum current increasing rate at the time 300 hours after the operation start is 37.12% of Sample 20, and the minimum is 12.08% of Sample 19.

In a case where the time when the deterioration rate reaches 20% is defined to be an unusable condition, a life time of the comparative semiconductor laser device is estimated from FIG. 4 to be approximately 400 hours even in the comparative semiconductor laser device showing the lowest deterioration rate, that is, Sample 19. At the time of 300 hours lapsed, the deterioration rate of Sample 20 already reaches 37%, and Samples 16, 17 and 18 are also in almost unusable states.

<Experiment 2>

Figure 5:
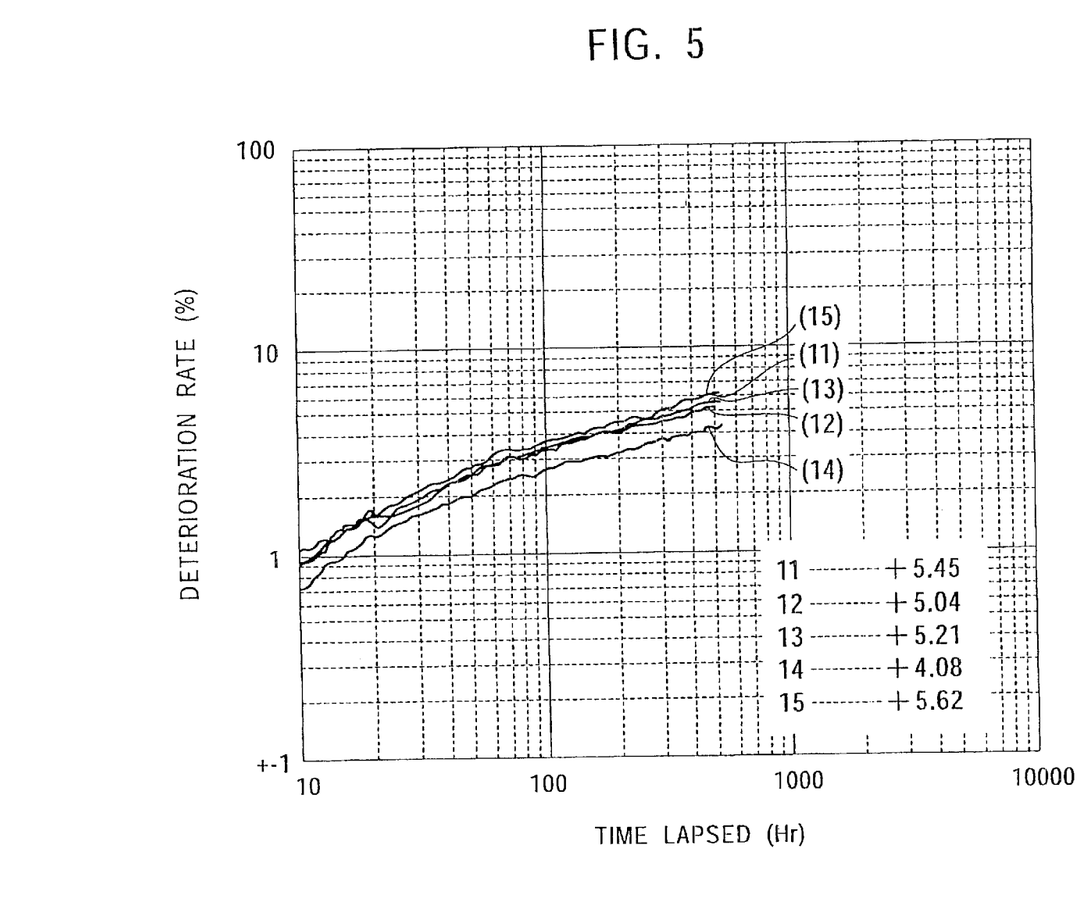
FIG. 5 is a graph showing a result of Experiment 2, which shows relationship between the lapsed time after start of the operation of sample semiconductor laser devices and deterioration rate corresponding to the lapsed time.

Subsequently, semiconductor laser devices having the same structure as the semiconductor laser device 10 of the present embodiment (hereinafter, referred to as a "sample semiconductor laser device") are fabricated as Samples 11, 12, 13, 14 and 15. Each of the sample semiconductor laser devices is continuously operated at a constant light output, and, in accordance with the time lapsed after the start of the operation, each operational current is measured to calculate an increasing rate of the operational current. FIG. 5 shows the results thereof. Each of the reference numerals 11, 12, 13, 14 and 15 corresponds to each of the sample numbers of the sample semiconductor laser devices.

As can be seen from FIG. 5, the deterioration rate of the sample semiconductor laser devices are remarkably low in comparison with the case of the comparative semiconductor laser device. The maximum of the current increasing rate at the time 500 hours after the operation start is 5.62% of Sample 15, and the minimum is 4.09% of Sample 14.

In the case where the time when the deterioration rate reaches 20% is defined to be an unusable condition, as in Experiment 1, a life time of the sample semiconductor laser device is estimated from FIG. 5 to be approximately 3,000 hours even in the sample semiconductor laser device showing a relatively high deterioration rate, that is, Sample 15.

<Experiment 3>

In addition, five pieces of semiconductor laser devices having the same structure as the conventional semiconductor laser device 50 having an $SiO_2$ film as the protection layer 64, as shown in FIG. 6, (hereinafter, referred to as "conventional semiconductor laser devices") are fabricated and subject to the operational experiment as in the cases of Experiments 1 and 2, described above. As a result, after the operation start, all of the five conventional semiconductor laser devices become impossible to oscillate before 10 hours lapses.

In view of the results of Experiments 1–3, it is exemplified that the life time of the semiconductor laser device 10 in which the protection layer 24 being a semiconductor epitaxial layer provided on the upper surface of the lower layer 18b of the second cladding layer 18 and side planes of the ridge 22 so as to protect them is dramatically improved in comparison with the conventional semiconductor device and the comparative semiconductor laser device.

In addition, since in the semiconductor laser device of the present embodiment, the injection current-light output characteristics are also improved, and the operational current required is 3 mA less than the conventional air ridge type semiconductor laser device at the same light output.

Furthermore, since the internal loss being small, which is a characteristic feature of the air ridge structure, is maintained to be substantially the same value as that of the conventional air ridge type semiconductor laser device, as a result, the internal loss is 5 $cm^{-1}$ less than that of the general embedded type waveguide obtained by embedding GaAs.

In the present embodiments, although the AlGaInP-containing semiconductor laser device is taken as an example to explain the present invention, the present invention is not limited to the material and may be applied to semiconductor laser devices of, for example, InP-containing, GaInP-containing, InGaAsP-containing or the like.

Although the invention has been described in its preferred form with a certain degree of particularity, obviously many changes and variations are possible therein. It is therefore to be understood that the present invention may be practiced otherwise than as specifically described herein without departing from the scope and the sprit thereof.

What is claimed is:

1. An air ridge type semiconductor laser device comprising a structure including an active layer sandwiched between a first cladding layer and a second cladding layer each having a conductivity type different from each other, said second cladding layer comprising an upper layer which forms a ridge stripe and a lower layer positioned below the upper layer, which extends outwardly from both lower ends of the upper layer, and a protection layer provided on an upper surface of said lower layer of said second cladding layer and on side planes of said ridge stripe other than an upper surface thereof, wherein:

said protection layer is a compound semiconductor layer epitaxially grown on the upper surface of said lower layer of said second cladding layer and the side planes of said ridge stripe; and a difference between a lattice constant of said protection layer and a lattice constant of said second cladding layer is 6% or less of the lattice constant of said second cladding layer.

2. The semiconductor laser device according to claim 1, wherein said compound semiconductor layer constituting said protection layer is a compound semiconductor layer having a conductivity type different from that of said second cladding layer.

3. The semiconductor laser device according to claim 1, wherein a film thickness of said protection layer is greater than or equal to 0.15 $\mu$m and less than or equal to 0.3 $\mu$m.

4. The semiconductor laser device according to claim 1, wherein a film thickness of said lower layer of said second cladding layer is 0.6 $\mu$m or less.

5. The semiconductor laser device according to claim 1, wherein said structure having said active layer sandwiched between said first cladding layer and said second cladding layer each having a conductivity type different from each other comprises an AlGaInP-containing compound semiconductor and said protection layer comprises either one of GaAs and GaInP.

6. A method for manufacturing an air ridge type semiconductor laser device, comprising the steps of:

a step of forming a multi-layer structure by forming a first cladding layer, an active layer, a second cladding layer and a contact layer, each comprising a compound semiconductor layer, on a compound semiconductor substrate, using the epitaxial growth method;

a step of etching said contact layer and said second cladding layer in said multi-layer structure to form a ridge stripe comprising said contact layer and an upper layer of said second cladding layer, and a lower layer of said second cladding layer, which extends outwardly from both lower ends of the upper layer;

a step of epitaxially growing a protection layer comprising a compound semiconductor layer having a different conductivity type from said second cladding layer on an upper surface of said second cladding layer other than an upper surface of said contact layer and on side planes of said ridge stripe using the selective area growth method; and a step of forming a metal film on an upper surface of said contact layer to form an electrode for ohmic contact with said contact layer.

* * * * *